(12) United States Patent
Worley, Sr. et al.

(10) Patent No.: US 6,486,726 B1
(45) Date of Patent: Nov. 26, 2002

(54) LED DRIVER CIRCUIT WITH A BOOSTED VOLTAGE OUTPUT

(76) Inventors: Eugene Robert Worley, Sr., 11 Bowditch, Irvine, CA (US) 92620; Eugene Robert Worley, Jr., 11 Bowditch, Irvine, CA (US) 92620

(*) Notice: Subject to any disclaimer, the term of this patent is extended or adjusted under 35 U.S.C. 154(b) by 0 days.

(21) Appl. No.: 09/859,310

(22) Filed: May 18, 2001

(51) Int. Cl.$^7$ .................. H01L 31/00; H03K 17/78
(52) U.S. Cl. ........................ 327/514; 327/589
(58) Field of Search ...................... 327/365, 514, 327/536, 589, 309, 310, 320, 321, 325, 326

(56) References Cited

U.S. PATENT DOCUMENTS

| | | | | |
|---|---|---|---|---|
| 5,384,457 A | * | 1/1995 | Sommer | 250/214 R |
| 5,909,139 A | * | 6/1999 | Williams | 327/434 |
| 5,933,441 A | * | 8/1999 | Chen | 327/524 |
| 6,356,469 B1 | * | 3/2002 | Roohparvar et al. | 327/536 |
| 6,359,392 B1 | * | 3/2002 | He | 315/291 |

* cited by examiner

*Primary Examiner*—My-Trang Nu Ton

(57) ABSTRACT

A Light Emitting Diode (LED) driver circuit with a boosted voltage output for driving an LED from a voltage power supply having a voltage that is lower than the turn "on" voltage of the LED is provided. A charge pump provides the boosted voltage output of the LED driver circuit. During operation, the LED driver circuit switches the LED on and off at a predetermined frequency such that a human observer perceives the LED to be continuously turned "on". In one embodiment, the LED driver circuit further comprises a current regulator for regulating the current supplied to the LED. In another embodiment, the LED driver circuit comprises a voltage regulator to regulate the boosted voltage output of the LED driver circuit.

18 Claims, 14 Drawing Sheets

LED DRIVER CIRCUIT WITH A BOOSTED VOLTAGE OUTPUT

BACKGROUND OF THE INVENTION

1. Field of the Invention

The field of the invention is Light Emitting Diode (LED) driver circuits, and more particularly, LED driver circuits with a boosted voltage output for driving an LED from a voltage power supply having a voltage that is lower than the turn "on" voltage of the LED.

2. Description of the Related Art

LEDs are commonly used as status indicator lights and in numerical and alpha-numerical displays. LEDs are also used in opto-couplers to transmit optical signals between circuits. Such opto-couplers are typically used to provide a communications link between circuits that are electrically isolated from each other.

LEDs are typically driven by an integrated circuit using an LED driver circuit. This is because the output of many integrated circuits can not supply the current needed to turn on an LED. FIG. 1 shows a conventional LED driver circuit for driving an LED 100. The LED driver circuit comprises a bipolar transistor 115, a collector resistor 111, and a base resistor 120. The collector resistor 110, which is used to set the current level supplied to the LED 100, is connected between a voltage power supply 105 and the anode of the LED 100. The collector terminal of the transistor 115 is connected to the cathode of the LED 100, and the emitter terminal of the transistor 115 is connected to ground. One end of the base resistor 120 is connected to the base terminal of the transistor 115. The other end of the base resistor 120 is used for the input 122 of the LED driver circuit, which may be driven by the output of a logic gate in an integrated circuit (not shown). The base resistor 120 determines the input 122 impedance of the LED driver circuit and, thus, the drive requirement at the input 122.

Historically, the voltage power supplies used to power integrated circuits have had voltages greater than the turn "on" voltages of many LEDs, which typically range from about 1.6 V to 3.6 V. This has allowed the use of the same voltage power supplies to power both integrated circuits and LEDs using conventional LED driver circuits. However, as the dimensions of integrated circuits have continued to be scaled down, the voltages of many voltage power supplies used to power integrated circuits have been reduced to values approaching the turn "on" voltage of many LEDs. Recently, the voltage used to power many integrated circuits have been migrating from 5.0 V to 3.3 V. Ultimately, the voltage used to power many integrated circuits may be reduced to a value below 1 V. As a result, the voltage power supplies used to power many integrated circuits may eventually be unable to power LEDs using conventional LED driver circuits, thereby creating the need for separate voltage power supplies to power the LEDs.

Even as the voltages used to power integrated circuits remain above the turn "on" voltage of many LEDs, the trend towards reduced voltages to power integrated circuits may lead to a degradation of the current control of conventional LED driver circuits. This can be illustrated by way of an example in which a 3.3 V voltage power supply 105 is used to power the LED driver circuit of FIG. 1. In this example, the 3.3V voltage power supply 105 has a maximum and a minimum worst case voltage of 3.6V and 3.0 V, respectively, and the LED 100 has a turn "on" voltage of 2.5 V. The resistance of the collector resistor 10 is chosen such that the current supply to the LED 100 is about 10 mA at a nominal voltage power supply 105 voltage of 3.3 V. Assuming that the transistor 115 has a collector-emitter voltage drop of approximately 0.2 V, the current supply level to the LED 100 varies between 15 mA and 5 mA for the maximum and minimum worst case voltages of the voltage power supply 105, respectively. As a result, the LED driver circuit of FIG. 1 may exhibit poor current control to an LED 100 when the voltage of the voltage power supply 105 approaches the turn "on" voltage of the LED 100.

Therefore, there is a need for an LED driver circuit having a boosted voltage output capable of driving an LED from a voltage power supply having a voltage that is lower than the turn "on" voltage of the LED. This would allow an integrated circuit and the LED to be powered by the same voltage power supply when the voltage power supply has a voltage that is lower than the turn "on" voltage of the LED. In addition, the expense of having to provide separate voltage power supplies to power the integrated circuit and the LED may be avoided. There is also a need for an LED circuit driver that exhibits good current supply control to an LED when the voltage of the voltage power supply approaches the turn "on" voltage of the LED.

SUMMARY OF THE INVENTION

Embodiments of the present invention provide LED driver circuits with a boosted voltage output for driving an LED from a voltage power supply having a voltage that is lower than the turn "on" voltage of the LED.

An LED driver circuit, built in accordance with one embodiment of the present invention, comprises an input buffer and a charge pump, both of which are connect to a voltage power supply having a voltage of Vdd. The charge pump boosts the voltage of the voltage power supply at its output in order to drive an LED having a turn "on" voltage that is comparable to or greater than the voltage of the voltage power supply. The input buffer receives a control signal at its input and either enables or disables the charge pump based upon the received control signal.

In another embodiment of a preferred embodiment, the charge pump of the LED driver circuit comprises an oscillator, an inverter, a capacitor, and a diode. The oscillator has an input connected to the output of the input buffer and an output. The inverter has an input connected to the output of the oscillator and an output. The capacitor has a low electrode connected to the output of the inverter and a high electrode connected to the anode of the LED being driven. The anode of the diode is connected to the voltage power supply and the cathode of the diode is connected to the high electrode of the capacitor.

When enabled by the input buffer, the oscillator outputs a pulsing signal that alternately switches the inverter between a high output state and a low output state. When switched to the low output state by the pulsing signal, the inverter pulls the low electrode of the capacitor down to ground. The diode is forward biased and current flows from the voltage power supply to the high electrode of the capacitor through the diode. This current charges up the capacitor, raising the voltage at the high electrode of the capacitor to approximately Vdd–Vt, where Vt is the potential drop across the diode. When switched to the high output state by the pulsing signal, the inverter raises the voltage at the low electrode of the capacitor to Vdd. This voltage rise at the low electrode of the capacitor causes the voltage at the high electrode of the capacitor to rise above Vdd–Vt due to capacitive coupling. The high electrode of the capacitor rises until it reaches the turn "on" voltage of the LED, at which point, the capacitor discharges through the LED, causing the LED to turn "on".

In another embodiment of a preferred embodiment, the diode of the charge pump is implemented using a diode-connected PFET. In the forward direction, the source of the PFET is connected to the voltage power supply, the drain of the PFET is connected to the high electrode of the capacitor, and the body of the PFET is connected to the drain of the PFET via a large value resistor. This type of body connection weakly forward biases the body-source junction of the diode connected PFET in the forward direction, thereby lowering the magnitude of the threshold voltage $V_t$ of the PFET. By lowering the magnitude of the threshold voltage $V_t$ in the forward direction, the potential drop across the diode connected PFET is decreased, thereby increasing the voltage boosting capability of the LED driver circuit.

In another embodiment of a preferred embodiment, a second charge-pump stage is connected to the LED driver circuit in order to increase the voltage boosting capability of the LED driver circuit. The second charge pump stage comprises a second inverter, a second diode, and a second capacitor. The second inverter has an input connected to the output of the first inverter and an output. The second capacitor has a low electrode connected to the output of the second inverter and a high electrode connected to the anode of the LED being driven. The anode of the second diode is connected to the cathode of the first diode and the cathode of the second diode is connected to the high electrode of the second capacitor.

In another embodiment of a preferred embodiment, the LED driver circuit drives two LEDs. The LED driver circuit according to this embodiment comprises a ring counter and a first and second NFET switch. Each one of the NFET switches is connected to the ring counter and one of the two LEDs being driven. During operation, the ring counter alternately switches on the first and second NFET switch to alternately turn "on" the two LEDs.

In another embodiment of a preferred embodiment, a switch/current regulator is connected between the cathode of the LED being driven and ground in order to regulate the current level flowing through the LED. In one embodiment, the regulated current level is set by a reference current.

In another embodiment of the present invention, the LED driver circuit comprises a voltage regulator to regulate the boosted voltage output. In one embodiment, the voltage regulator is connected in series between the voltage power supply and the charge pump. When the voltage, Vdd, of the voltage power supply exceeds a predetermined voltage, Vdd', the voltage regulator reduces the voltage Vdd to the voltage Vdd', which is outputted to the charge pump. Otherwise, the voltage regulator passes the voltage, Vdd, of the power voltage supply to the charge pump. In another embodiment, the LED driver circuit regulates the boosted voltage output by controlling a charge-up voltage of first capacitor based upon a comparison of the charge-up voltage of the first capacitor and a reference voltage. In another embodiment, the LED driver regulates the boosted voltage output by controlling whether or not the inverter boosts the voltage of the first capacitor based upon a comparison of the power supply voltage, Vdd, and a reference voltage.

In another embodiment of the invention, the LED driver comprises an NFET switch, a first PFET switch, a second PFET switch and a capacitor. The gate of the NFET is driven by a clock signal B, the drain of the NFET is connected to the gate of the first PFET, and the source of the NFET is connected to ground. The source of the first PFET is connected to the voltage power supply, and the body of the first PFET is connected to the drain of the first PFET through a resistor. The gate of the second PFET is driven by a clock signal C, the drain of the second PFET is connected to the drain of the NFET, and the body of the second PFET is connected to the source of the second PFET 1215. The capacitor has a low electrode driven by a clock signal A, and a high electrode connected to the drain of the first PFET and the source of the second PFET. In this embodiment, current flows from the voltage power supply to the capacitor through the first PFET switch to charge up the capacitor.

In another embodiment of the present invention, the LED driver provides a continuous current to the LED being driven for applications in which the LED can not be switched "on" and "off", i.e., pulsed.

In another embodiment of the present invention, the LED driver circuit of any one of the various embodiments of the invention and an LED are packaged together in an LED lamp package. The LED lamp package according to this embodiment includes a ground lead, an input control lead, and a voltage supply lead, wherein the ground lead includes a reflector dish. The LED lamp package further includes an LED driver chip comprising the LED driver circuit and an LED chip comprising the LED. Both the LED driver chip and the LED chip are mounted onto the reflector dish of the ground lead. The power supply lead is connected to the LED driver chip by a first bond wire, the input lead is connected to the LED driver chip by a second bond wire, and the LED driver chip is connected to the LED chip by a third bond wire. The top portions of the three lead are enclosed by a light transparent encapsulate.

In another embodiment of the present invention the LED lamp package does not include the input control lead. In this embodiment, the LED driver circuit on the LED driver chip is configured to automatically turn on when a sufficiently high voltage power supply is applied to the LED driver circuit.

Other objects and features of the present invention will become apparent from consideration of the following description taken in conjunction with the accompanying drawings.

DETAILED DESCRIPTION OF THE PREFERRED EMBODIMENTS

The following is provided to enable any person skilled in the art to make and use the invention and sets forth the best modes contemplated by the inventors of carrying out their invention.

Figure 1:
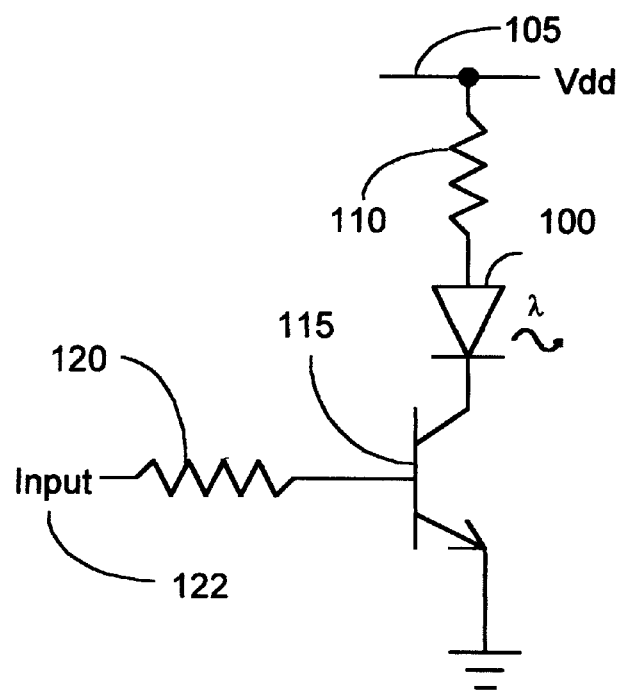
FIG. 1 shows a prior art LED driver circuit
Figure 2:
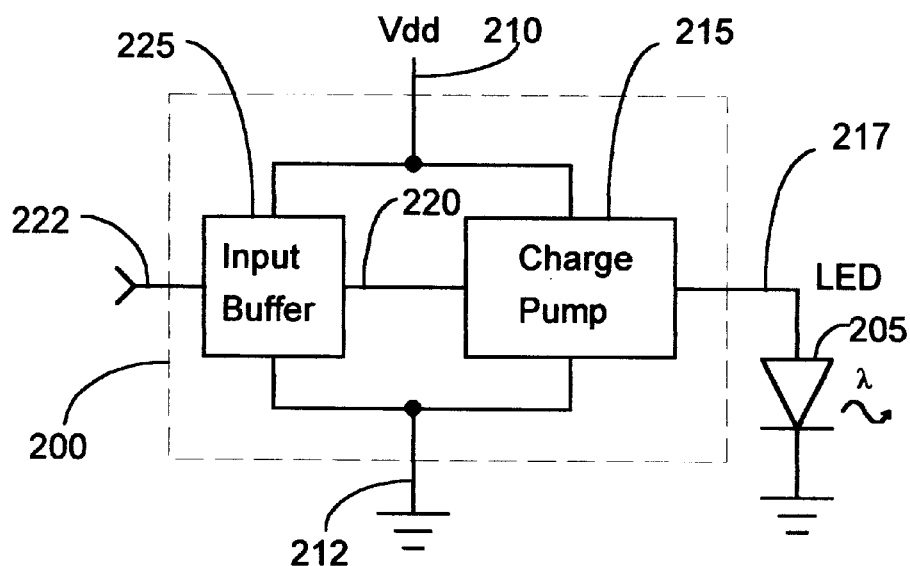
FIG. 2 shows a block diagram of an LED driver circuit according to an embodiment of the present invention.

Turning to the drawings, FIG. 2 shows a block diagram of an LED driver circuit 200 according to an embodiment of the invention driving an LED 205. The LED driver circuit 200 comprises a charge pump 215 and an input buffer 225, both of which are connected between a voltage power supply 210 and a ground 212. The voltage power supply 210 has a voltage of Vdd, which is comparable to or lower than the turn "on" voltage of the LED 205 being driven. The charge pump 215 has an input 220 and an output 217 connected to the anode of the LED 205. The cathode of the LED 205 is connected to ground 212. The charge pump 215 boosts the voltage of the voltage power supply 210 at its output 217. This enables the charge pump 215 to power an LED 205 having a turn "on" voltage exceeding the voltage, Vdd, of the voltage power supply. The input buffer 225 has an input 205 connected to an output of an integrated circuit (not shown) and an output connected to the input 220 of the charge pump 215. The integrated circuit may be powered by the same voltage power supply 210 as the LED driver circuit 200. Preferable, the input buffer 225 has a high impedance at its input 222 to minimize the current load on the output of the integrated circuit. The input 222 of the input buffer 225 may be connected to the output of a logic gate (not shown) in the integrated circuit, wherein the logic gate outputs a control logic signal to the input buffer 225.

The input buffer 225 controls the charge pump 215 in response to the control logic signal received at its input 222. The input buffer 225 may, for example, enable the charge pump 215 to turn on the LED 205 when it receives a high level logic signal, e.g., a logic one, at its input 222. Furthermore, the input buffer 225 may disable the charge pump 215 to turn off the LED 205 when it receives a low level logic signal, e.g., a logic zero, at its input 222.

Figure 3:
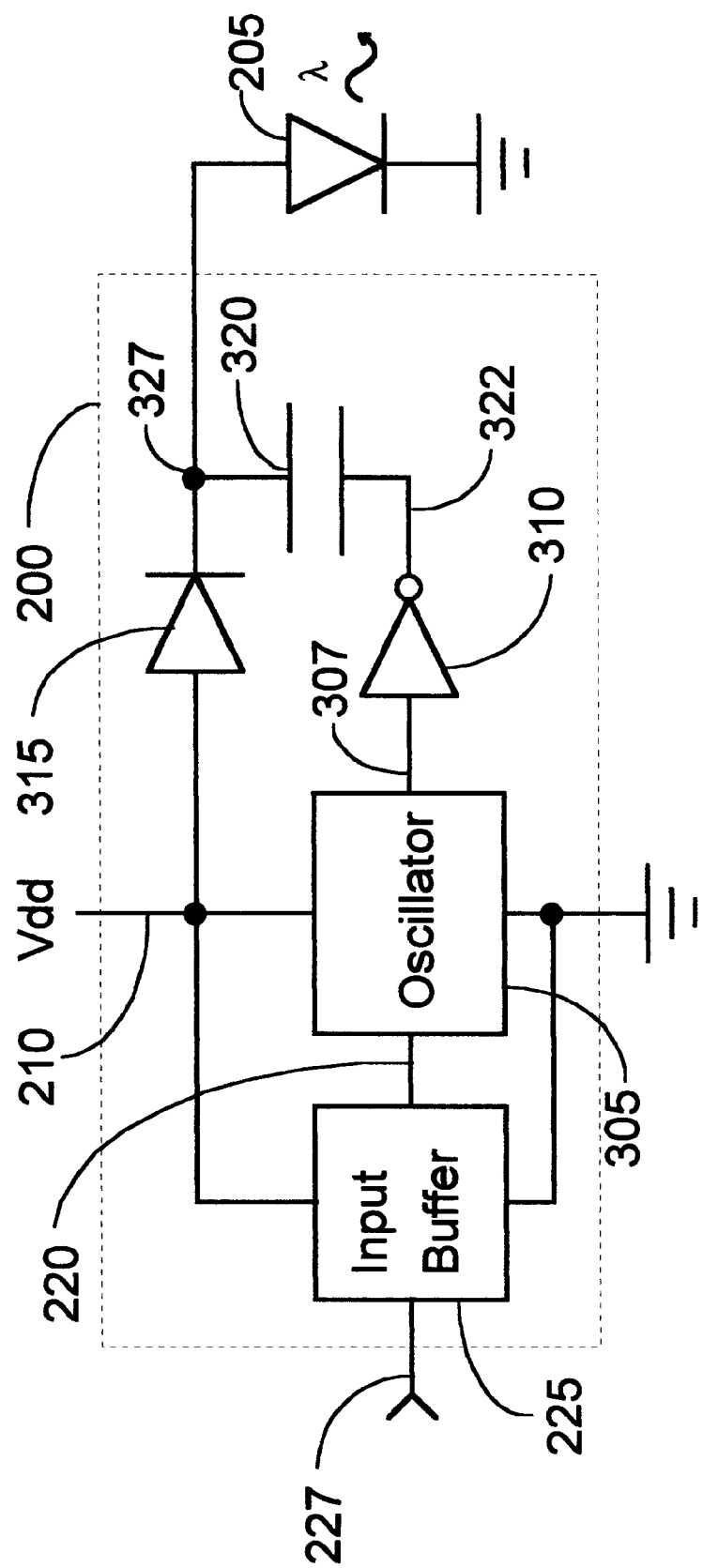
FIG. 3 shows an LED driver circuit according to an embodiment of the present invention.

FIG. 3 shows an LED driver circuit 200 according to an embodiment of the invention. The LED driver circuit 200 according to this embodiment comprises an oscillator 305, an inverter 310, a capacitor 320, and a diode 315. The oscillator 305 has an input connected to the output 220 of the input buffer 225 and an output. The inverter 310 has an input 307 connected to the output of the oscillator 305 and an output. The capacitor 320 has a low electrode 322 connected to the output of the inverter 320 and a high electrode 327 connected to the anode of the LED 205 being driven. The anode of the diode 315 is connected to the voltage power supply Vdd and the cathode of the diode 315 is connected to the high electrode 327 of the capacitor 320. The diode 315 may be, but is not limited to, a PN junction diode, a diode connected MOSFET, or a diode connected bipolar transistor.

During operation, the input buffer 225 accepts a control logic signal, at its input 222 from an external source, e.g., an integrated circuit, and then translates the received control logic signal into an internal control logic signal at its output 220. The internal control logic signal of the input buffer 225 either enables or disables the oscillator 305 based upon the received control logic signal. For example, the input buffer 225 may enable the oscillator 305 when the control logic signal at its input 222 is a high level logic signal, and may disable the oscillator 305 when the control logic signal at its input 222 is a low level logic signal.

When enabled by the input buffer 225, the oscillator 305 outputs a pulsing signal that alternates between a high voltage and a low voltage at a predetermined frequency. The high voltage of the pulsing may be approximately equal to the voltage of the power supply voltage 210, Vdd, and the low voltage of the pulsing may be approximately equal to ground. The pulsing signal of the oscillator 305 alternately switches the inverter 310 between a high output state and a low output state. As a result, the inverter 310 alternately drives the low electrode 322 of the capacitor between a low voltage and a high voltage. Preferably, the inverter 310 has a high output state voltage approximately equal to Vdd and a low output state voltage approximately equal to ground. In addition, the inventor 310, preferably, has a high input impedance to minimize the current load on the oscillator 305 output. The diode 315 conducts current in the forward direction from the voltage power supply 210 to the high electrode 327 of the capacitor 308, while blocking current in the reverse direction from the high electrode 327 of the capacitor to the voltage power supply 210.

When switched to the low output state by the pulsing signal of the oscillator 305, the inverter 310 drives, i.e., pulls, the low electrode 322 of the capacitor 320 down to approximately ground. The diode 315 is forward biased and current flows from the voltage power supply 210 to the high electrode 327 of the capacitor 308 through the diode 315. This current charges up the capacitor 320, raising the voltage at the high electrode 327 of the capacitor 320 to approximately Vdd−Vt, where Vt is the potential drop across the diode 315. This assumes that the LED 205 has a turn "on" voltage that exceeds Vdd−Vt so that the LED 205 remains turned off during the charge up of the capacitor 320.

When switched to the high output state by the pulsing signal of the oscillator 305, the inverter 310 drives, i.e., raises, the voltage of the low electrode 322 of the capacitor 320 to approximately Vdd. This voltage rise at the low electrode 322 of the capacitor 320 causes the voltage at the high electrode 327 of the capacitor 320 to rise above Vdd−Vt due to capacitive coupling between the low electrode 322 and the high electrode 327 of the capacitor 320. The high electrode 327 of the capacitor 308 rises until it reaches the turn "on" voltage of the LED 205, assuming that the LED 205 has a turn "on" voltage below 2 Vdd−Vt. At this point, the capacitor 320 discharges through the LED 205, causing the LED 205 to turn "on". After the capacitor has discharged through the LED 205, the inverter 310 is switched back to the low output state in order to replenish charge on the capacitor 320.

The LED driver circuit 200 according to this embodiment does not continuously turn "on" the LED 205 when the oscillator 305 is enabled, but rather turns "on" the LED during the time that the inverter 310 is switched to the high output state by the pulsing signal of the oscillator 305. Thus, the LED driver circuit 200 alternately switches the LED 205 "on" and "off" at the frequency of the pulsing signal. Fortunately, the human eye is a time-averaging light detector. As a result, the pulsing signal can pulse, i.e., switch, the LED 205 "on" and "off" at a high enough frequency such that the human eye perceives the LED as being continuously turned "on". For example, a red LED was pulsed by a square-waveform current source having a peak current of about 17 mA and a duty cycle of ½. A human observer perceived the red LED to be continuously turned "on" when the frequency of the current source was about 40 Hz and above.

The LED driver circuit 200 according to this embodiment is capable of driving an LED 205 having a turn "on" voltage approaching 2 Vdd–Vt. The LED driver circuit 200 is an example of a voltage doubler because it has an open-circuit output voltage 217 that approaches 2 Vdd as the potential drop across the diode, Vt, approaches zero. The open-circuit output voltage represents the output voltage of the LED driver circuit 200 when it is not loaded down by the LED 205.

Those skilled in the art will appreciate that the capacitor 320 can be integrated on the same chip as the rest of the LED driver circuit 200 or can be a discrete component. For applications requiring a large capacitor, it may be preferable to use a discrete capacitor since integrating a large capacitor onto a chip may require too large a chip area. Those skilled in the art will also appreciate that the oscillator 305 may be configured to automatically turn on when the voltage power supply is applied to the LED driver circuit 200, instead of having the input buffer 225 enable or disable the oscillator 305 based upon an input control logic signal. In addition, those skilled in the art will appreciate that the input buffer 225 may include a latch for latching a received input control logic signal in the input buffer 225.

The charge pump of the LED driver circuit 200 according the present invention differs from a conventional charge pump. A conventional single-stage charge pump includes a rectifier, typically a diode, connected between the capacitor and the load being driven. The rectifier is used to allow current to flow from the capacitor to the load, while blocking current flow from the load to the capacitor. A disadvantage of the rectifier is that there is a potential drop across the rectifier, which reduces the voltage boosting capabilities of the conventional charge pump. The charge pump of the LED driver circuit 200 according to the present invention does not include a rectifier connected between the capacitor 320 and the load, i.e., the LED 205. This is because the LED 205 is itself a rectifier in that it conducts a large amount of current in the forward direction from the capacitor 320 to the LED 205, and a very small amount of current in the reverse direction. As a result, there is no need to connect a rectifier between the capacitor 320 and the LED 205. By not including the rectifier between the capacitor 320 and the LED 205 the charge pump according to the present invention is able to eliminate the potential drop across the rectifier, thereby improving the voltage boosting capabilities of the charge pump, and to reduce component costs.

Figure 4A:
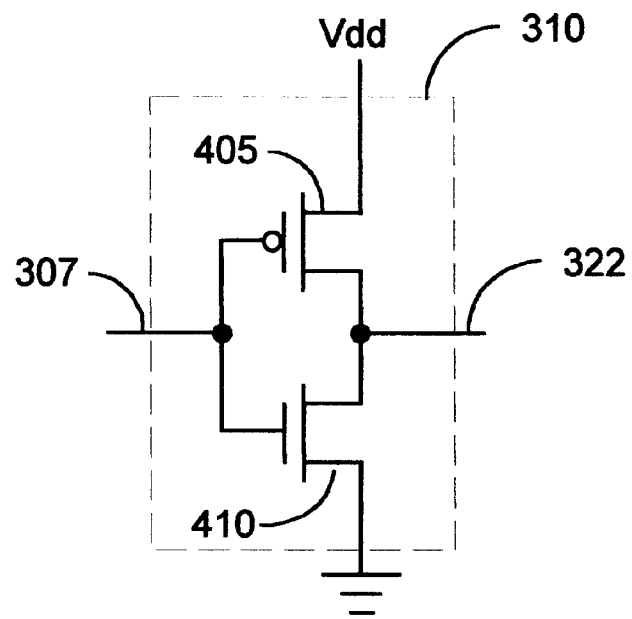
FIG. 4A shows a CMOS inverter for use in an LED driver circuit according to the present invention.

The current level supplied to the LED 205 may be adjusted by adjusting the output current level of the inventor 310 used in raising the voltage at the low electrode 322 of the capacitor 320 to Vdd after the capacitor 320 has been charged up. This is because, as the capacitor 320 discharges through the LED 205, the current level being supplied to the LED 205 by the capacitor 320 is approximately equal to the current being supplied to the low electrode 322 of the capacitor 320 from the inverter 310. One way to adjust the output current level of the inverter 310 is to employ a CMOS inverter 310, shown in FIG. 4A. The CMOS inverter comprises a PFET 405 connected between the voltage power supply 210 and the low electrode 322 of the capacitor 320 and an NFET 410 connected between the low electrode 322 of the capacitor 320 and ground. The CMOS inverter supplies current to the low electrode 322 of the capacitor 320 from the voltage power supply 210 through the PFET 405. The output current level of the CMOS inverter 310 to the low electrode 322 of the capacitor 320 may be adjusted by adjusting the channel width and/or channel length of the PFET 405.

Figure 4B:
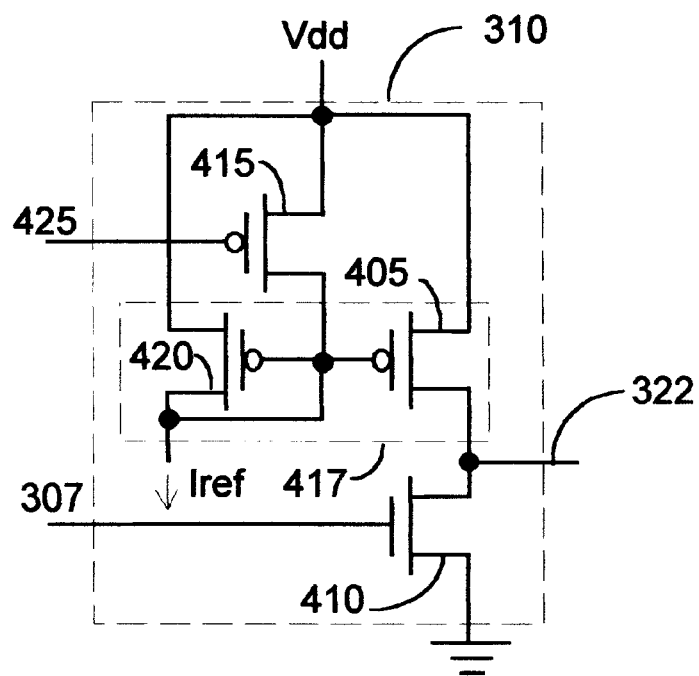
FIG. 4B shows a CMOS inverter comprising a current mirror for use in an LED driver circuit according to the present invention.

FIG. 4B shows a CMOS inverter 310 according to another embodiment in which the output current level of the CMOS inverter to the low electrode 322 of the capacitor 320 is set by a reference current, Iref. The CMOS inverter 310 according to this embodiment comprises a second PFET 420, and a third PFET 415. The source of the second and third PFET 420 and 415 are both connected to the voltage power supply. The drain of the third PFET 415 is connected the gates of the first and second PFET 405 and 420. The gate of the third PFET 415 is connected to an input signal 425 that is the inverse of the oscillator output 307. In other words, the input signal 425 is high when the oscillator output 307 is low and vice versa. The drain and the gate of the second PFET 420 are tied together. The reference current, Iref, flows out of the drain of the second PFET 420.

The third PFET 415 turns on the first and second PFET 405 and 420 when the oscillator output 307 is low and turns off the first and second PFET 405 and 420 when the oscillator output 307 is high. The first and second PFET 405 and 420 are connected in a current mirror configuration forming current mirror 417. As a result, when the first and second PFET 405 and 420 are turned on, the current flowing through the first PFET 405 is set by the reference current, Iref, flowing out of the drain of the second PFET 420. The current flowing through the first PFET 405 is equal to the reference current, Iref, multiplied by the ratio of the channel widths of the first PFET 405 to the second PFET 420, assuming that both PFETs have the same channel lengths. Preferably, the reference current, Iref, is cut off by a switch (not shown) when the first and second PFET 405 and 420 are turned off by the third PFET 415.

Figure 5:
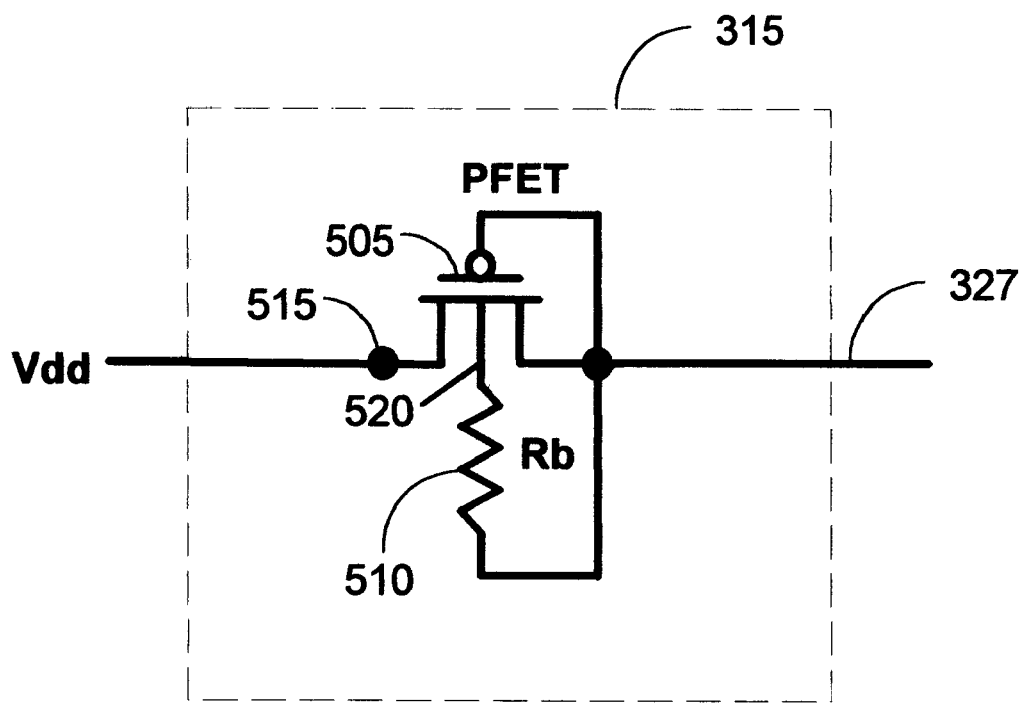
FIG. 5 shows a diode-connected PFET for use in an LED driver circuit according to the present invention.

FIG. 5 shows an example of a diode-connected PFET 505 according to an embodiment of the invention, which may be used to implement the diode 315 of FIG. 3.

The PFET 505 may be fabricated in an N well in a P-type substrate using a standard CMOS process. In the forward direction, the source of the PFET 505 is connected to the voltage power supply, and the drain of the PFET 505 is connected to the high electrode 327 of the capacitor. In addition, the gate of the PFET 505 is connected to the drain of the PFET 505, and the body 520 of the PFET .505 is also connected to the drain of the PFET via a large value resistor 510, Rb. In this example, the body 520 of the PFET 505 is assumed to be an N well in a P-type substrate. This type of body connection weakly forward biases the body-source junction of the diode connected PFET 505 in the forward direction, thereby lowering the magnitude of the threshold voltage $V_t$ of the PFET 505. By lowering the magnitude of the threshold voltage $V_t$ in the forward direction, the potential drop across the diode connected PFET 505 is decreased, thereby increasing the voltage "doubling" capability of the LED driver circuit 200 of FIG. 3. The resistor 510 is used to limit the current flowing into the body of the PFET 505 in order to minimize parasitic bipolar collector current which may flow into the P-type substrate from the body 520 of the PFET 505.

In the reverse direction, the drain of the PFET 505 in the forward direction becomes the source of the PFET 505 and vise versa. Thus, the body 520 of the PFET 505 is connected to the source of the PFET 505 via the resistor Rb 510 in the reverse direction. As a result, the body-source junction of the PFET 505 is zero biased and the magnitude of the threshold voltage $V_t$ of the PFET 505 is not lowered in the reverse direction. Therefore, the leakage current of the PFET 505 is not increased in the reverse direction.

Those skilled in the art will appreciate that a diode-connected NFET may be used instead of the PFET 505 to implement the diode. The NFET may be fabricated in a P well in an N-type substrate using a standard CMOS process.

Figure 6:
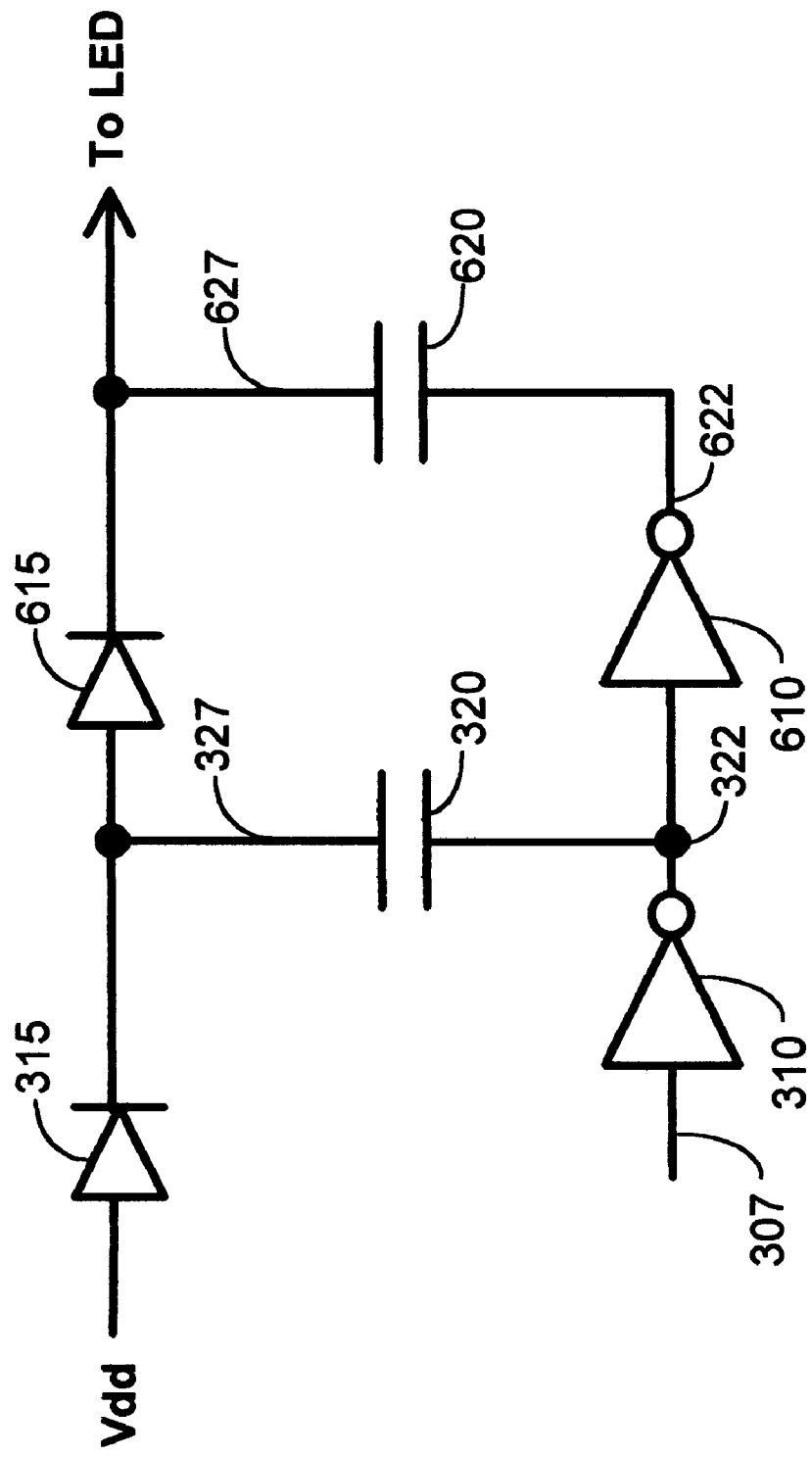
FIG. 6 shows a two-stage LED driver circuit according to an embodiment of the present invention.

FIG. 6 shows a two-stage LED driver circuit according to another embodiment of the invention. The two-stage LED driver circuit according to this embodiment comprises all of the elements of the LED driver circuit of FIG. 3. In addition, the two-stage LED driver circuit further comprises a second charge pump stage comprising a second inverter 610, a second diode 615, and a second capacitor 620. The second inverter 610 has an input connected to the output of the first inverter 310 and an output. The second capacitor 620 has a low electrode 622 connected to the output of the second inverter 610 and a high electrode 627 connected to the anode of the LED being driven. The anode of the second diode 615 is connected to the cathode of the first diode 315 and the cathode of the second diode 615 is connected to the high electrode 627 of the second capacitor 620.

During operation, the pulsing signal of the oscillator 305 alternately switches the first inverter 310 between the high output state and the low output state. In addition, the output of the first inverter 310 alternately switches the second inverter 610 between the high output state and the low output state such that the second inverter 610 is in the low output state when the first inverter 310 is in the high output state and vise versa. When the first inverter 310 is switched to the low output state, the first capacitor 320 charges up through the first diode 315, raising the voltage at the high electrode 327 of the first capacitor 320 to approximately $Vdd-Vt_1$, where $Vt_1$ is the potential drop across the first diode 315. When the first inverter 310 is switched to the high output state, the voltage at the high electrode 327 of the first capacitor 320 rises above $Vdd-Vt_1$. When the voltage at the high electrode 327 of the first capacitor 320 rises to a high enough value to forward bias the second diode 615, some of the charge of the first capacitor 320 is transferred to the second capacitor 620 through the second diode 615. This transfer of charge raises the voltage at the high electrode 627 of the second capacitor 620. When the second inverter 622 is switched to the high output state, the voltage at the high electrode 627 of the second capacitor 620 is raised even further. The LED driver circuit according to this embodiment has an open-circuit output voltage of approximately $3 Vdd-Vt_1-Vt_2$, where $Vt_2$ is the potential drop across the second diode 615.

The two-stage LED driver circuit of FIG. 6 is an example of a voltage tripler. A voltage quadrupler or higher may be realized as required by the voltage, Vdd, of the voltage power supply 210 and the turn "on" voltage of the LED 205. This may be accomplished, for example, by cascading additional charge pump stages to the LED driver circuit of FIG. 6 as required, with each additional charge pump stage comprising an inverter, a capacitor and a diode.

Figure 7A:
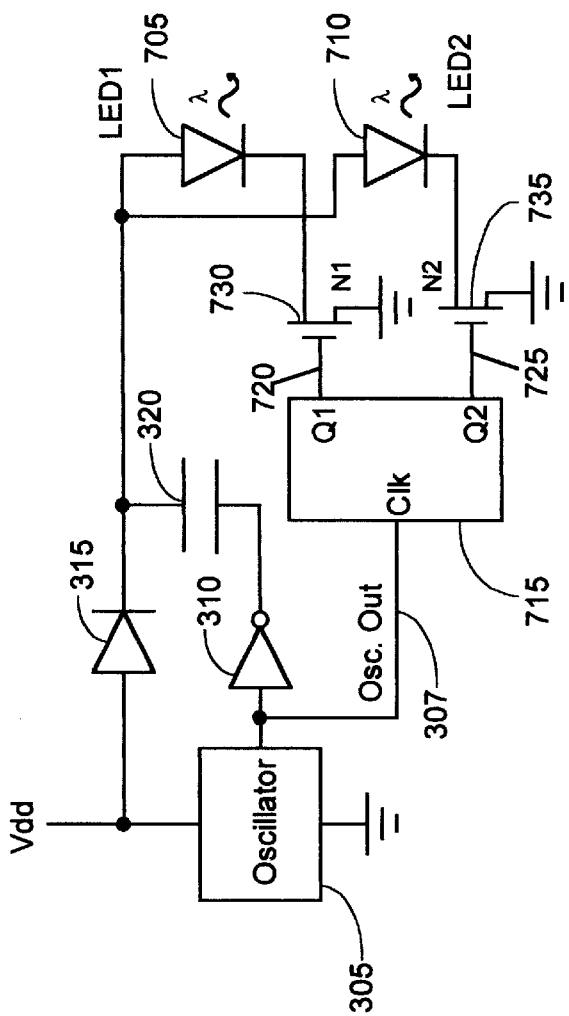
FIG. 7A shows an LED driver circuit capable of driving two LEDs according to an embodiment of the present invention.

FIG. 7A shows an LED driver circuit capable of driving two LEDs according to another embodiment of the invention. Such an LED driver circuit may be used, for example, for powering LED segments in a numeric or alpha-numeric display. The LED driver circuit according to this embodiment comprises a ring counter 715 having a clock input connected to the output 307 of the oscillator 305, a Q1 output 720 and a Q2 output 725. The LED driver circuit further comprises a first and second NFET ground switch 730 and 735, respectively. The drain of the first and second NFET switch 730 and 735 are connected to the cathode of the first and second LED 705 and 710, respectively, and the gate of the first and second NFET switch 730 and 735 are connected to the Q1 720 and Q2 output 725 of the ring counter 715, respectively. The source of the first and second NFET switch 730 and 735 are both connected to ground.

Figure 7B:
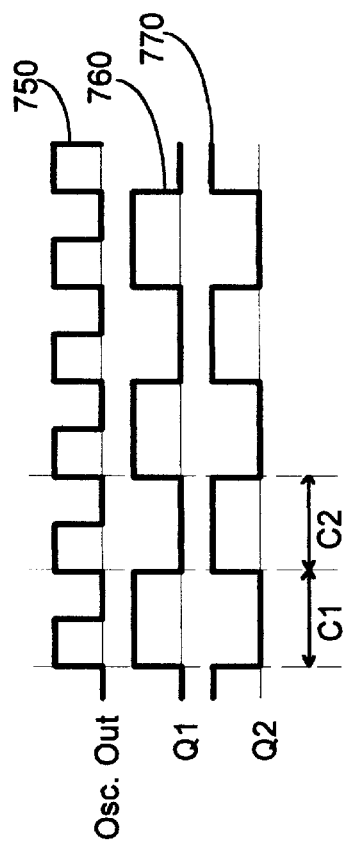
FIG. 7B shows a time line of signals in the LED driver circuit of FIG. 7A.

The operation of the LED driver circuit according to this embodiment will now be explained with reference to FIG. 7B, which shows an exemplary time line of the oscillator output signal 750 and the Q1 output signal 760 and the Q2 output signal 770. The oscillator output signal 750 is a pulsing signal used for sequencing the ring counter 725. The Q1 output signal 760 and the Q2 output signal 770 of the ring counter 715 are each driven to a high state during alternate cycles or periods of the oscillator output signal 750. As a result, the first and second NFET switch 730 and 735 are alternately turned on, thereby alternately turning "on" the first and the second LEDs 705 and 710.

During a first cycle C1 of the oscillator output signal 750, the Q1 output signal 760 is driven to the high state, thereby turning on the first NFET switch 730. The first NFET switch 730 couples the first LED 705 to ground, allowing current to flow from the LED driver circuit into the first LED 705. Thus, the LED driver circuit turns "on" the first LED 705 during the first cycle C1 of the oscillator output signal 750. At the same time, the Q2 output signal 770 is driven to the low state, thereby turning off the second NFET switch 735 and the second LED 710.

During a second cycle C2 of the oscillator output signal 750, the Q2 output output signal 770 is driven to a high state, thereby turning on the second NFET switch 735. The second NFET switch 735 couples the second LED 710 to ground, allowing current to flow from the LED driver circuit into the second LED 710. Thus, the LED driver circuit turns "on" the second LED 710 during the second cycle C2 of the oscillator output signal 750. At the same time, the Q1 output signal 760 is driven to the low state, thereby turning off the first NFET switch 730 and the first LED 705.

An advantage of the LED driver circuit according to this embodiment is that it can drive two LEDs using a single capacitor 320. This keeps the component count and cost of the LED driver circuit down to a minimum. In addition, the LED driver circuit according to this embodiment, preferably, alternately turns "on" the first and second LED 705 and 710 at a high enough switching frequency so that both LEDs appear to be continuously turned "on" to the human eye.

The concept of the LED driver circuit according to this embodiment may be extended to drive more than two LEDs. This may be accomplished, for example, by using a ring counter with more than two Q outputs and more than two NFET switches to alternately turn "on" more than two LEDs. Although the LED driver circuit according to this embodiment has been described using NFET switches, those skilled in the art will appreciate that other switches may be used, including, but not limited to, PFET switches and bipolar transistor switches.

Figure 8:
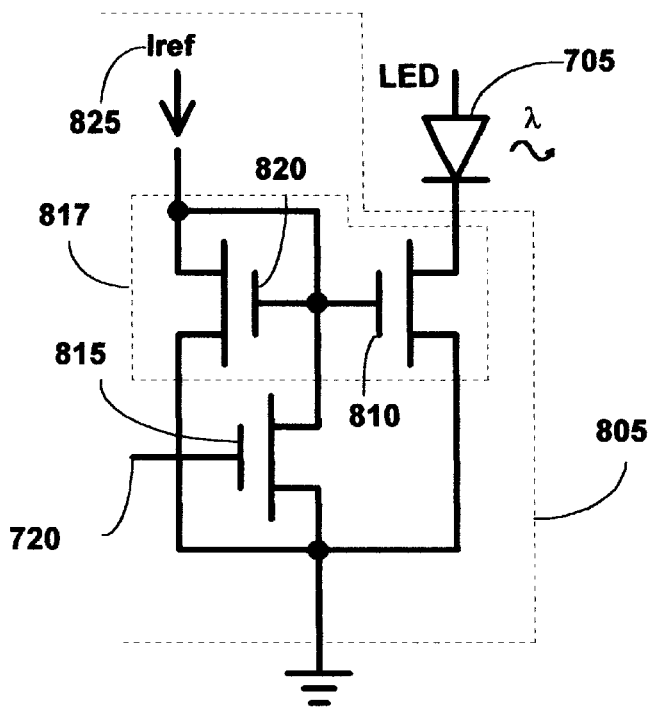
FIG. 8 shows a switch/current regulator for use in an LED driver circuit according to the present invention.

FIG. 8 shows a switch/current regulator 805 that may be used in place of the NFET switches 730 and 735 of FIG. 7A. The switch/current regulator 805 used to replace the first NFET switch 730 will be discussed, although it is to be understood that the same switch/current regulator 805 can be used to replace the second NFET switch. The switch/current regulator comprises a first NFET 815, a second NFET 810, and a third NFET 820. The drain of the first NFET 815 is connected to the gates of the second and third NFET 810 and 820. The drain of the second NFET 810 is connected to the cathode of the LED 705, and the drain of the third NFET 820 is tied to the gate of third NFET 820. The sources of all the NFETs 810, 815 and 8120 are connected to ground. The gate of the first NFET 815 is connected to the Q1 output 720 of the ring counter 715. The first NFET 815 is used for switching the second and third NFET 810 and 820 on and off according the Q1 output 720. For example, the first NFET 815 switches on the second and third NFET 810 and 820 when the Q1 output 720 is in the low state and switches off the second and third NFET 810 and 820 when the Q1 output 720 in is the high state.

The second and third NFET 810 and 820 are connected in a current mirror configuration forming current mirror 817. This enables the switch/current regulator 805 to regulate the current flowing through the LED 705 to a predetermined level when the LED 705 is turned "on". The regulated current level is set by a reference current level, Iref, flowing into drain of the third NFET 820. The regulated current level is equal to the reference current, Iref, multiplied by a ratio of the channel widths of the second NFET 810 to the third NFET 820, assuming that both NFETs have the same channel length. The ratio of the channel widths of the second NFET 810 to the third NFET 820 may be adjusted, for example, by connecting a number of NEFTs in parallel with the first NFET and/or the second NFET. Preferably, the reference current Iref is cut off by a switch (not shown) when the second and third NFET 810 and 820 are switched off by the first NFET 815.

The switch/current regulator 805 not only regulates the current flowing through the LED 705, but also blocks any potential "feed through" current from flowing into the LED 705 when the LED is suppose to be turned off. The switch/current regulator 805 is not limited for use in the LED driver circuit of FIG. 7A and may be used, for example, in the LED driver circuit of FIG. 3 to regulate the current flowing into the LED 205. In this case, the gate of the first NFET 810 may be connected the output of the oscillator 305.

In order to design an LED driver circuit that can operate over a wide range of different power supply voltages, some form of voltage regulation may be required, especially if the LED driver circuit is a voltage tripler or higher. Ideally, for a voltage power supply of 1.0V, a voltage tripler produces an open-circuit voltage of 3.0V at its output. However, if a 3.0V voltage power supply is connected to the same voltage tripler, then the voltage tripler may produce a voltage of 9.0V at its output, which, for many modern CMOS processes, is too high a voltage. Such a high voltage hazard may arise if the output of the voltage tripler is not being loaded down by an LED. In addition, if the current of the LED is not regulated and the voltage, Vdd, of a voltage power supply exceeds the turn "on" voltage of the LED, then a large current may flow from the voltage power supply into the LED without any charge pumping. Thus, in order for an LED driver circuit to operate over a wide range of application using widely different power supply voltages, a voltage regulator may be required in the LED driver circuit.

Figure 9:
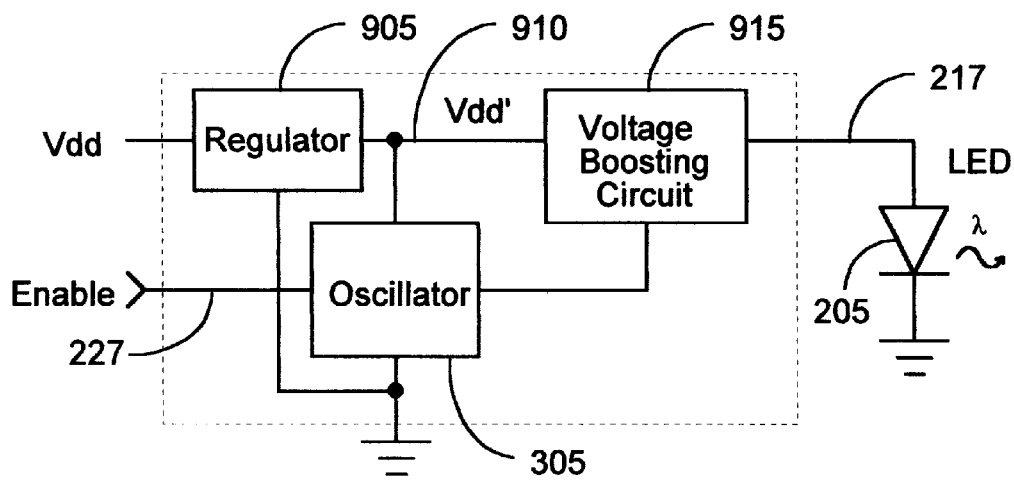
FIG. 9 shows an LED driver circuit comprising a series voltage regulator according to an embodiment of the present invention.

FIG. 9 shows an LED driver circuit further comprising a series voltage regulator 955 connected between the voltage power supply and the charge pump 915. When the voltage Vdd of the voltage power supply exceeds a predetermined voltage Vdd', the voltage regulator 905 reduces the voltage Vdd to the voltage Vdd', which is outputted 910 to the charge pump 915. Otherwise, the voltage regulator 905 passes the voltage Vdd of the power voltage supply to the charge pump 915.

Figure 10:
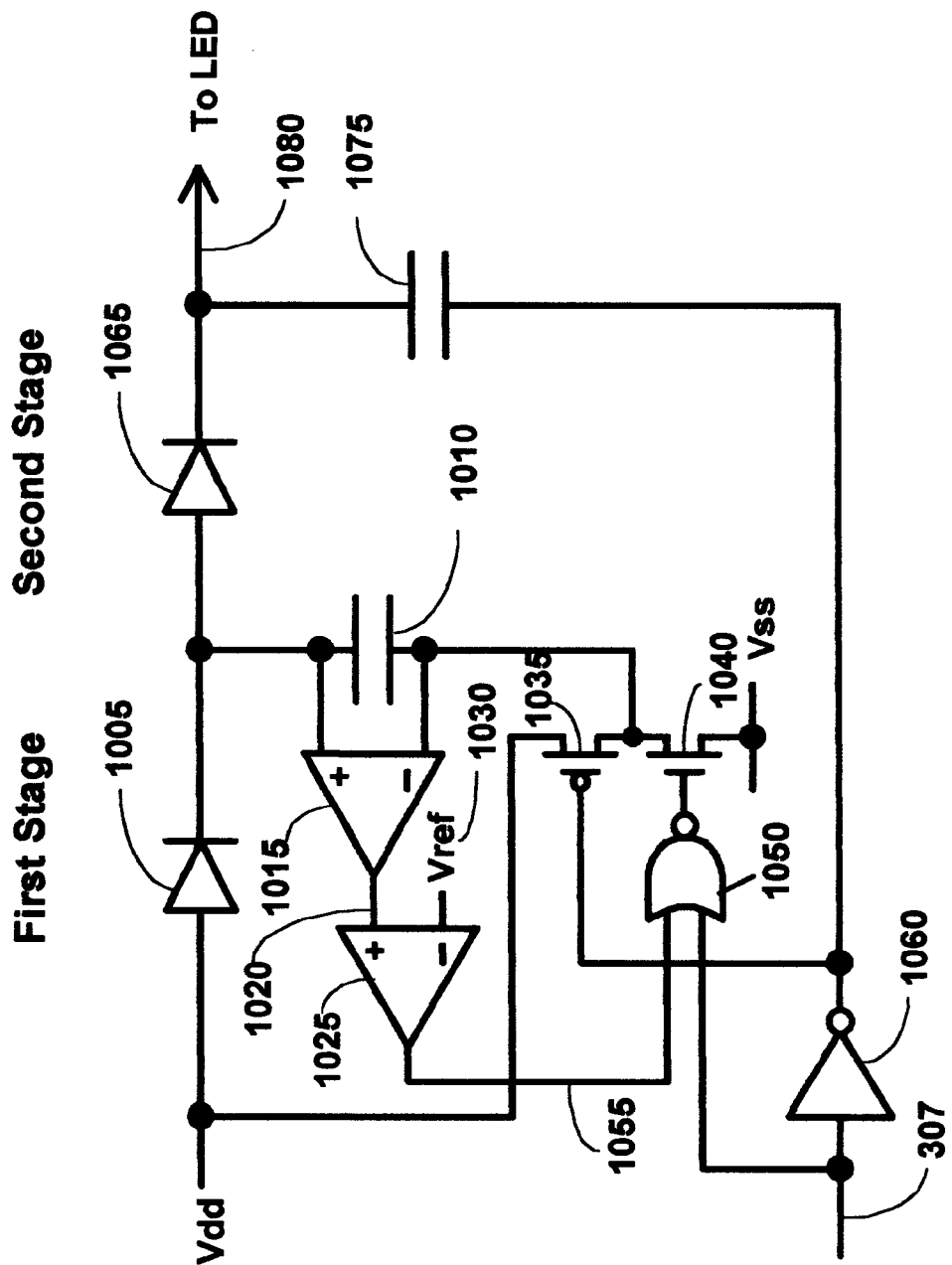
FIG. 10 shows a two-stage LED driver circuit comprising a voltage regulator according to an embodiment of the present invention.

FIG. 10 shows a two-stage LED driver circuit employing a form of voltage regulation according to an embodiment of the invention. The LED driver circuit according to this embodiment comprises a first and second charge pump stage. The first charge pump stage comprises a NOR gate 1050, an NFET switch 1040, a PFET switch 1035, a single-ended-output amplifier 1015, a comparator 1025, a first capacitor 1010 and a first diode 1005. The NOR gate 1050 has an input connected to the output of the comparator 1025, another input connected to the output 307 of the oscillator and an output connected to the gate of the NFET switch 1040. The first capacitor 1010 has a low electrode connected to the drains of the NFET 1040 and the PFET 1035, and a high electrode connected to the cathode of the first diode 1005. The source of the NFET 1040 is connected to ground, and the source of the PFET 1035 is connected to the voltage power supply Vdd. The amplifier 1015 has a positive and a negative input terminal connected to the high and low electrodes of the first capacitor 1010, respectively. The comparator 1025 has one input connected to the output of the amplifier 1015 and another input connected to a reference voltage Vref. The second charge pump stage comprises an inverter 1060, a second capacitor 1075, and a second diode 1065. The inverter has an input connected to the output 307 of the oscillator and an output connected to the gate of the PFET switch 1035. The second capacitor 1075 has a low electrode connected to the output of the inverter 1060, and a high electrode connected to the cathode of the second diode 1065. The anode of the second diode 1065 is connected to the high electrode of the first capacitor 1075.

During operation, the reference voltage Vref controls the voltage to which the first capacitor 1010 is charged-up, $V_{charge}$, through the first diode 1005. As the first capacitor 1010 is charged up through the first diode 1005, the amplifier 1015 measures the charge-up voltage, $V_{charge}$, of the first capacitor 1010 across its positive and negative input terminal. The amplifier 1015 then outputs a voltage that is proportional to the charge-up voltage, $V_{charge}$, of the first capacitor 1010.

For the simple case in which the amplifier 1015 has unity gain, the output voltage of the amplifier 1015 is simply $V_{charge}$. For a unity gain amplifier 1015, when the charge-up voltage $V_{charge}$ of the first capacitor 1010 is lower than the reference voltage Vref, the comparator 1025 has a low output state. This causes the NOR gate 1050 to have a high output state when the oscillator output is low. As a result, the NFET 1040 is turned on and the first capacitor 1010 is allowed to charge up through the first diode 1010. When, however, the charge-up voltage $V_{charge}$ of the first capacitor 1010 becomes greater than the reference voltage Vref, the comparator 1025 is switched from the low output state to a high output state. This causes the NOR gate to switch from the high output state to a low output state, thereby turning off the NFET switch. This in turn causes the first capacitor 1010 to discontinue charging up through the first diode 1005. In other words, the first capacitor 1005 discontinues charging up when $V_{charge}$ becomes greater than the reference voltage Vref. Therefore, the reference voltage Vref can be used to control, i.e., regulate, the charge-up voltage $V_{charge}$ of the first capacitor.

The open-circuit output voltage of the LED circuit driver according this embodiment is approximately $V_{charge}+2$ Vdd$-V_{f2}$, where $V_{f2}$ is the potential drop across the second diode 1065. Because the reference voltage Vref controls the charge-up voltage, $V_{charge}$, of the first capacitor 1010, the reference voltage Vref can be used to control the voltage boosting function of the LED driver circuit. For example, the maximum voltage boost of the LED driver circuit is obtained by setting the reference voltage Vref equal to Vdd. Assuming a unity gain amplifier, this causes the charge-up voltage $V_{charge}$ to be approximately equal to Vdd$-V_{f1}$, where $V_{f1}$ is the potential drop across the first diode 1005. This results in an open-circuit voltage of the LED driver circuit that is approximately 3 Vdd$-V_{f1}-V_{f2}$. The minimum voltage boost of the LED driver circuit is obtained by setting the reference voltage Vref equal to zero.

Figure 11:
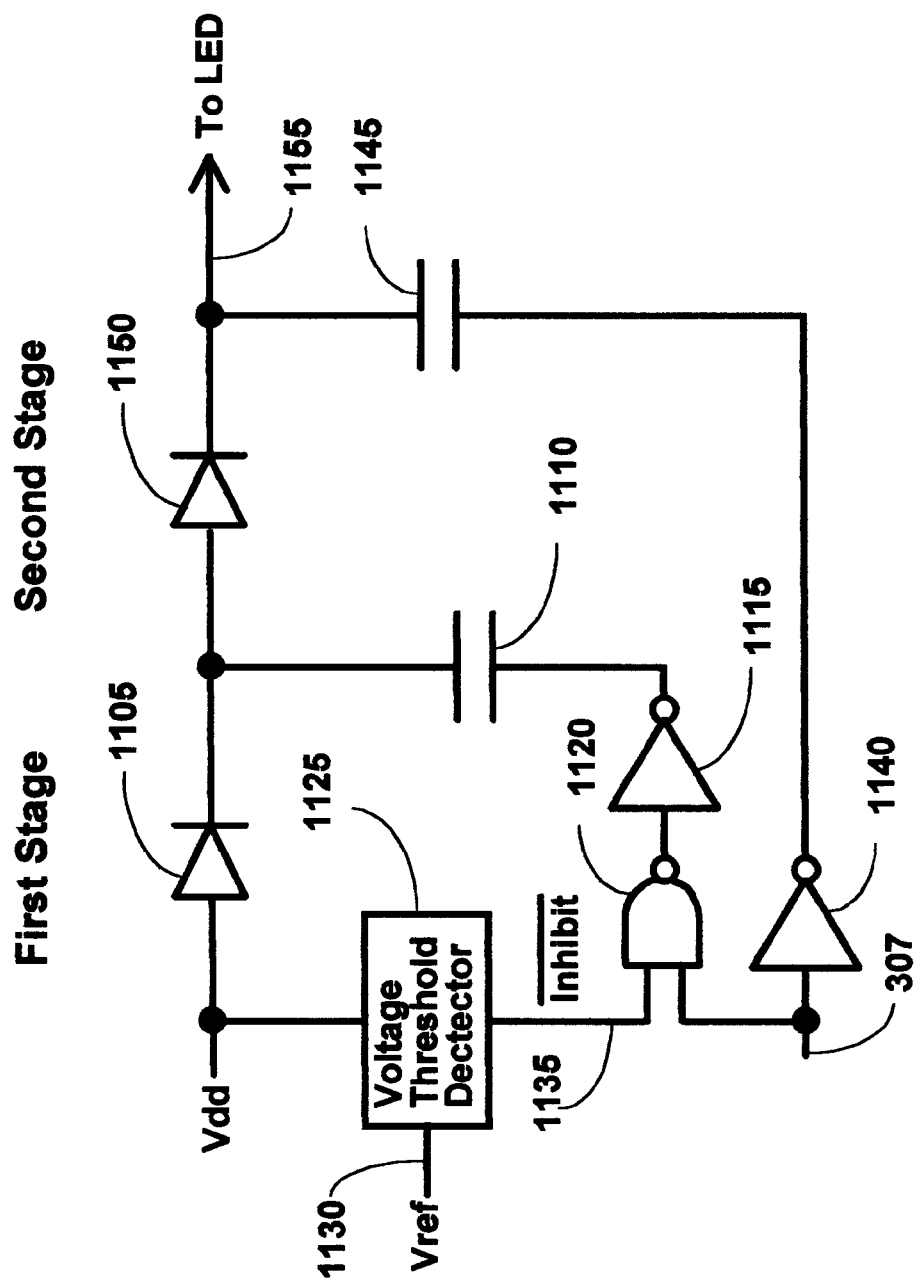
FIG. 11 shows a two-stage LED driver circuit comprising a voltage regulator according to another embodiment of the present invention.

FIG. 11 shows a two-stage LED driver circuit according to yet another embodiment of the invention. The two-stage LED driver circuit according to this embodiment comprises a first charge pump stage and a second charge pump stage. The first charge pump stage comprises a voltage threshold detector 1125, a NAND gate 1120, a first inverter 1115, a first capacitor 1110, a first diode 1105. The voltage threshold detector 1125 has one input connected to the voltage power supply Vdd, another input connected to a reference voltage Vref 1130, and an output 1135. The voltage threshold detector 1125 outputs a high state when the voltage Vdd is lower than the reference voltage Vref and outputs a low state when the voltage Vdd exceeds the reference voltage Vref. The NAND gate 1120 has one input connected to the output of the oscillator 307, another input connected to the output of the voltage threshold detector 1135, and an output. The inverter 1115 has an input connected to the output of the NAND gate 1120 and an output. The first capacitor 1110 has a low electrode connected to the output of the inverter and a high electrode connected to the cathode of the first diode 1105. The anode of the first diode 1105 is connected to the voltage power supply Vdd. The second charge pump stage comprises a second inverter 1140, a second capacitor 1145, and a second diode 1150. The second inverter 1140 has an input connected to the output of the oscillator 307. The second capacitor 1145 has a low electrode connected to the output of the second inverter and a high electrode connected to the cathode of the second diode 1155. The anode of the second diode 1150 is connected to the cathode of the first diode 1105.

During operation, the voltage threshold detector 1125 outputs a high state when the voltage Vdd is lower than the reference voltage Vref. This causes the NAND gate 1120 to output a low state to the inverter 1116 input when the oscillator output 307 is high. This enables the first inverter 1115 to raise, i.e., boost, the voltage at the low electrode of the first capacitor 1110 by Vdd after the capacitor 1110 has been charged up. Conversely, the voltage threshold detector 1125 outputs a low state when the voltage Vdd exceeds the reference voltage. This causes the NAND gate 1120 to output a high state to the input of the first inverter 1120. This inhibits the first inverter 1115 from raising the voltage of the first capacitor 1110 by Vdd after the first capacitor 1110 has been charged up. Thus, the voltage threshold detector 1125 controls the voltage boosting function of the LED driver circuit by controlling whether or not the first inverter 1115 raises, i.e. boosts, the voltage of first capacitor 1110 after the first capacitor 1110 has been charged up. The voltage threshold 1125 detector sets the LED driver circuit to an open-circuit boosted output voltage of 3 Vdd$-V_{f1}-V_{f2}$ when Vdd, is less than Vref and to an open-circuit boosted output voltage of 2 Vdd$-V_{f1}-V_{f2}$ when Vdd is greater than Vref.

Figure 12A:
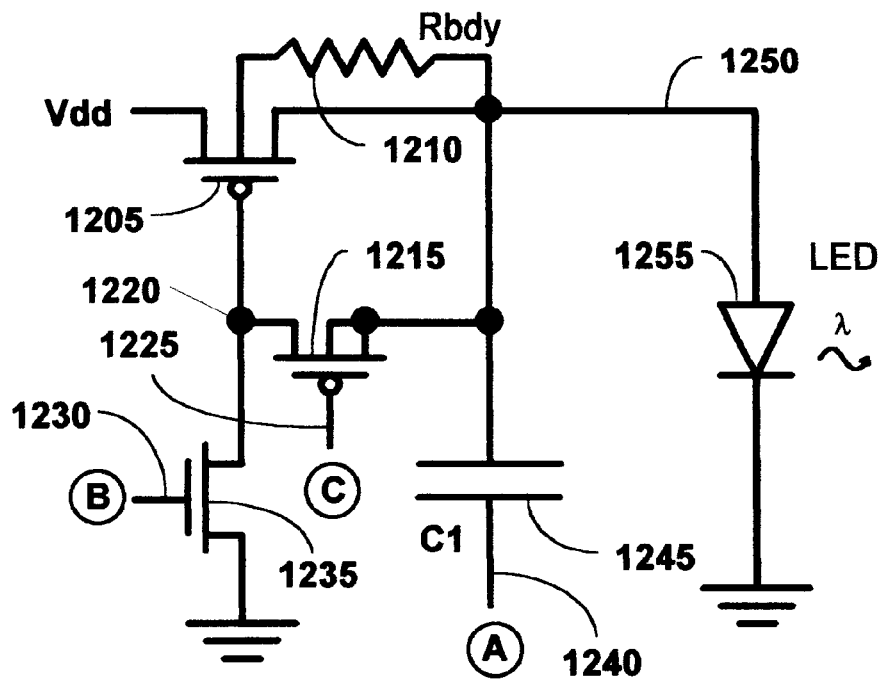
FIG. 12A shows an LED driver circuit comprising switches according to an embodiment of the present invention.
Figure 12B:
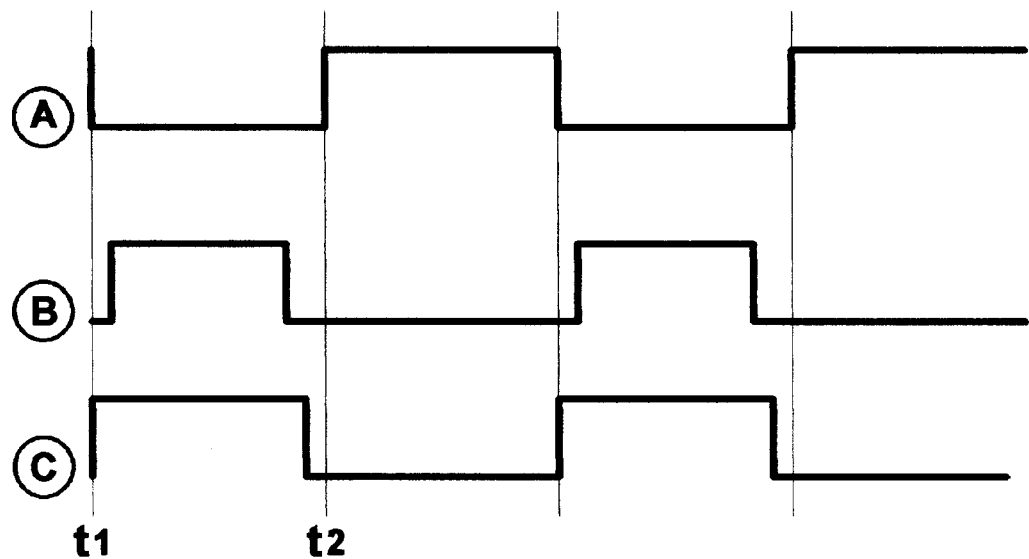
FIG. 12B shows a time line of exemplary clock signals for driving the switches of the LED driver circuit of FIG. 12B.

FIG. 12A shows an LED driver circuit according still yet another embodiment of the invention. FIG. 12B shows three exemplary clock signals, labeled A, B and C, for driving various nodes of the LED driver circuit according to this embodiment. Preferably, the clock signals have a high logic state approximately equal to Vdd and a low logic state approximately equal to ground. The LED driver circuit according to this embodiment comprises an NFET switch 1235, a first PFET switch 1205, a second PFET switch 1215, and a capacitor 1245. The gate 1230 of the NFET 1235 is driven by clock signal B, the drain of the NFET 1230 is connected to the gate of the first PFET 1205, and the source of the NFET 1235 is connected to ground. The source of the first PFET 1205 is connected to the voltage power supply Vdd, and the body of the first PFET 1205 is connected to the drain of the first PFET through a resistor Rbdy 1210. The gate 1225 of the second PFET 1215 is driven by the clock signal C, the drain of the second PFET 1215 is connected to the drain of the NFET 1235, and the body of the second PFET 1215 is connected to the source of the second PFET 1215. The capacitor 1245 has a low electrode 1240 driven by clock signal A, and a high electrode connected to the drain of the first PFET 1210 and the source of the second PFET 1215.

The resistor Rbdy 1210 is used to lower the magnitude of the threshold voltage $V_t$ of the first PFET 1205 when current flows through the PFET 1205 in the forward direction from voltage power supply Vdd to the high electrode of the capacitor 1245. The resistor Rbdy 1210 is also used to limit the current flowing into the body of the first PFET 1205 in order to minimize parasitic bipolar collector current which may flow into the P-type substrate. This assumes that the first PFET 1205 is fabricated in an N well in a P-type substrate.

During operation, the LED 1255 being driven is turned "on" during each cycle of the clock signals. One cycle begins at time t1 with the low electrode 1240 of the capacitor 1245 being grounded by clock signal A. In addition, the second PFET 1215 is turned off by clock signal C. After the second PFET 1215 has been turned off, the NFET 1235 is turned on by clock signal B. This grounds the gate of the first PFET 1205 through the NFET 1235, turning on the first PFET 1205. This allows current to flow from the voltage power supply Vdd to the high electrode of the capacitor 1245 through the first PFET 1205. As a result, the capacitor 1245 charges up to a voltage approximately equal to Vdd, assuming a small potential drop across the first PFET 1205.

At time t2, the NFET 1235 is turned off by clock signal B and the second PFET 1215 is turned on by clock signal C. The second PFET 1215 shorts together the drain and gate of the first PFET 1205. This turns off the first PFET 1205 when the voltage at the drain of the first PFET 1205 is raised above Vdd. The low electrode 1245 of the capacitor is raised to Vdd by clock signal A. This boosts the voltage at the low electrode 1245 of the capacitor 1245 to Vdd. This, in turn, boosts the open-circuit voltage output 1250 of the LED driver circuit to approximately 2 Vdd due to capacitive coupling.

An advantage of the LED driver circuit according to this embodiment is that the potential drop across the first PFET 1205 is small when current flows from the voltage power supply through the first PFET 1205 to charge up the high electrode of the capacitor 1245. As a result, the high electrode of the capacitor 1245 is able to charge up to a voltage approximately equal to Vdd. This enables the LED driver circuit according to this embodiment to achieve an open-circuit output voltage approximately equal to 2 Vdd.

Figure 13:
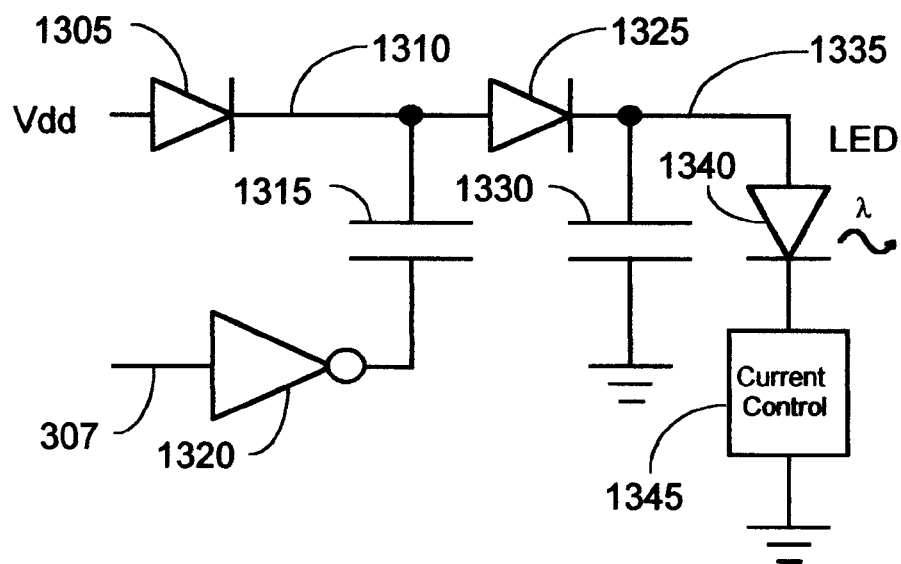
FIG. 13 shows an LED driver circuit for providing a continuous current to an LED according to an embodiment of the present invention.

FIG. 13 shows an LED driver circuit according to a further embodiment of the present invention. The LED driver circuit according to this embodiment provides a continuous current to an LED 1340 for applications in which the LED 1340 can not be switched "on" and "off", i.e., pulsed. The LED driver circuit according to this embodiment comprises an inverter 1320, a first and second capacitor 1315 and 1330, respectively, a first and second diode 1305 and 1325, respectively, and a current regulator 1345. The inverter 1320 has an input connected to the output of the oscillator 307 and an output. The first capacitor 1315 has a low electrode connected to the output of the inverter 1320 and a high electrode connected to the cathode of the first diode 1305. The anode of the first diode 1305 is connected to the voltage power supply Vdd. The second capacitor 1330 has a low electrode connected to ground and a high electrode connected to the cathode of the second diode 1325. The anode of the second diode 1325 is connected to the high electrode of the first capacitor 1315. The current regulator 1345 is connected between the cathode of the LED 1340 being driven and ground. The current regulator 1345 is used to set the current flowing into the LED and may be a current mirror.

During operation, the first capacitor 1315 is charged up from the voltage power supply Vdd through the first diode 1305 when the oscillator output 307 is low. The low electrode of the first capacitor 1315 is then raised to Vdd when the oscillator output 307 is high. This causes charge to transfer from the high electrode of the first capacitor 1315 to the high electrode of the second capacitor 1330 through the second diode 1325. The second capacitor 1330 is used to a provide approximately constant voltage at the output of the LED driver circuit above the turn "on" voltage of the LED 1340 being driven. This is done by having the high electrode of the first capacitor 1315 replenish charge to the high electrode of the second capacitor 1330 through the second diode 1325 by the same amount that the high electrode of the second capacitor 1330 discharges through the LED 1340 in turning "on" the LED. The first and second capacitor 1315 and 1330 may each be fabricated on the same chip as the rest of the LED driver circuit or, if the chip area required for the first and second capacitor is too large, then the first and second capacitor 1315 and 1330 may be made external to the rest of the LED driver circuit.

Figure 14A:
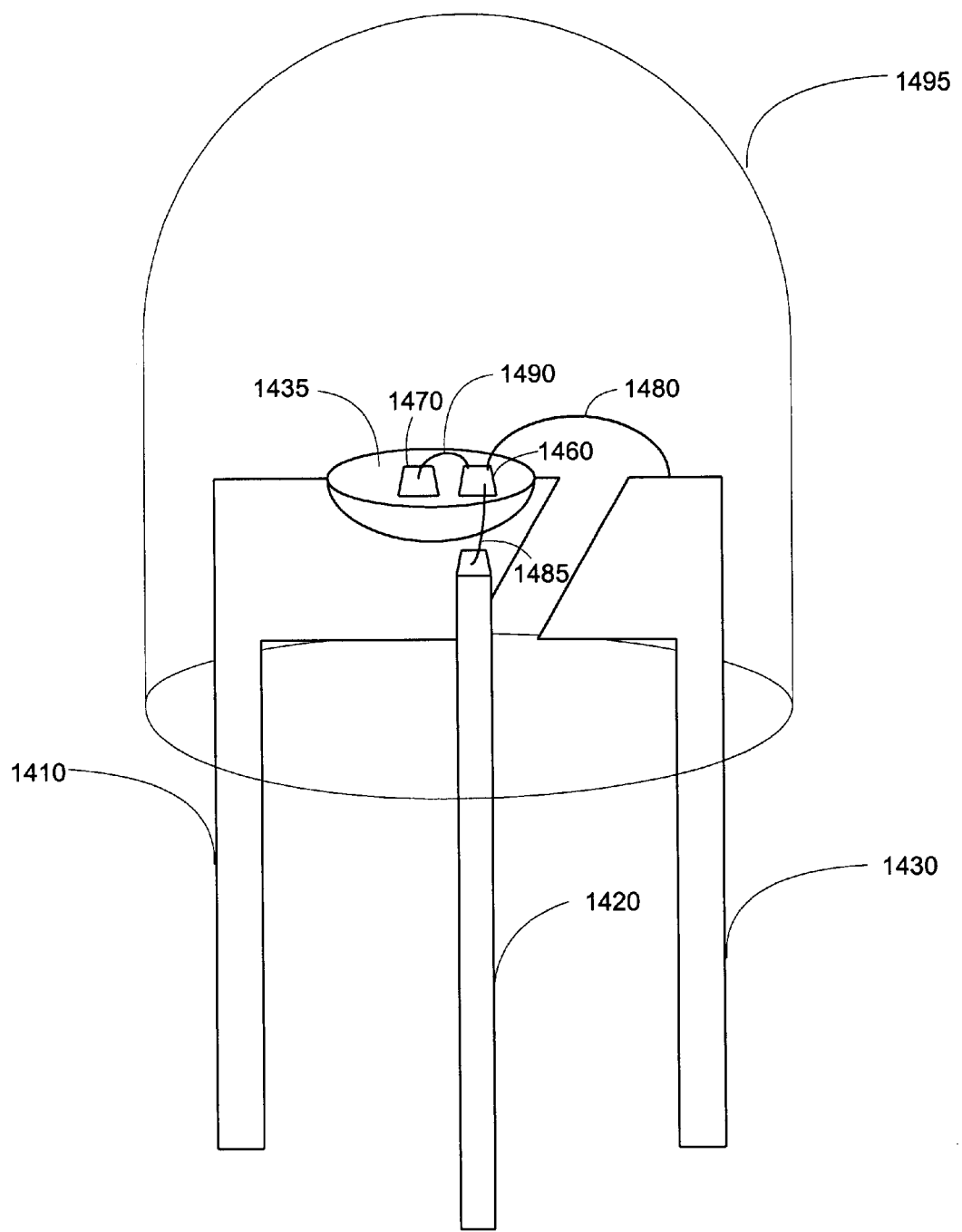
FIGS. 14A and 14B show a perspective view and a blown-up view of an LED lamp package according to an embodiment of the present invention.
Figure 14B:
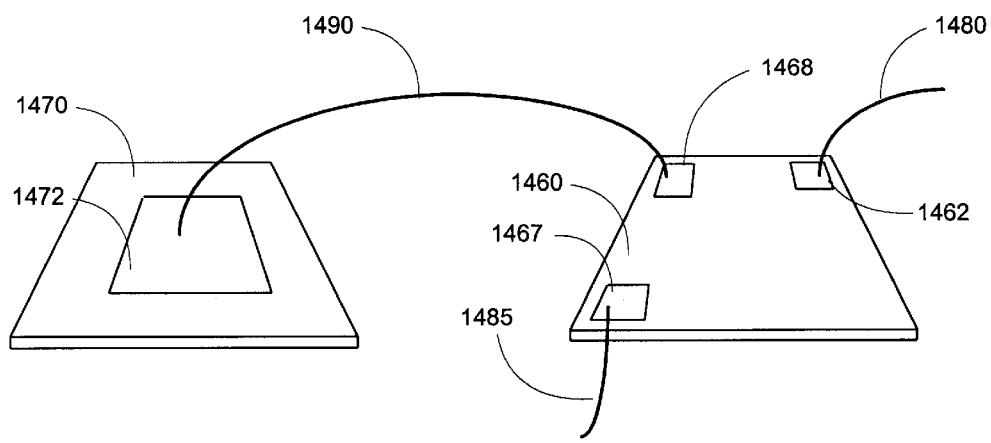

The LED driver circuit according to any one of the various embodiments of the invention and an LED can be packaged together in an led lamp package. FIGS. 14A and 14B show a perspective view and a blown-up view, respectively, of an LED lamp package 1405 according to an embodiment of the present invention. The LED lamp package includes a ground lead 1410, an input control lead 1420, and a voltage supply lead 1430. The leads may be made of metal, such as aluminum. The ground lead 1410 includes a reflector dish 1435, which may be pressed into the ground lead 1410.

The LED lamp package further includes an LED driver chip 1460, on which an LED driver circuit according to the invention is fabricated. The LED package also includes an LED chip 1470, on which an LED is fabricated. Both of the LED driver chip 1450 and the LED chip 1470 are mounted onto the reflector dish 1435 of the ground lead. Preferably, the substrate of each one of the chips 1460, 1470 is electrically coupled to the ground lead 1410. This may be done, for example, by affixing the bottom surface of each one of the chips 1460, 1470 to the reflector dish 1435 with an electrically conductive paste, such as a silver paste or a conductive epoxy. Although the LED driver chip 1460 is shown inside the reflector dish 1435, the LED driver chip may also be mounted to the side of the ground lead 1410, outside of the reflector dish 1435.

The LED lamp package further includes a first bond wire 1480 connecting the power supply lead 1430 to the LED driver chip 1460. One end of the first bond wire 1480 is connected to the power supply lead 1430. The other end of the first bond wire 1480 is preferably connected to a bonding pad 1462 on the LED driver chip 1460 connected to the voltage power supply input of the LED driver circuit. The LED package also includes a second bond wire connecting the input lead 1420 to the LED driver chip 1460. One end of the second bond wire 1485 is connected to the input lead 1420. The other end of the second bond wire 1485 is connected to a bonding pad 1467 on the LED driver chip 1460 connected to the control input of the LED driver circuit. The LED package further includes a third bond wire 1490 connected between the LED driver chip 1460 and the LED chip. One end of the third bond wire 1490 is connected to a bonding pad 1468 on the LED driver chip 1460 connected to the boosted voltage output of the LED driver circuit. The other end of the third bond wire 1490 is connected to a bonding pad 1472 on the LED chip 1470 that is connected to the anode of the LED.

Preferably, a light shield (not shown) is provided for shielding the LED driver circuit on the LED driver chip 1460 from light emitted by the LED on the LED chip 1470. The light shield may be provided, for example, by coating an opaque epoxy over the LED driver circuit on the LED driver chip 1460. Alternatively, the light shield may be provided by depositing a metal layer over the LED driver circuit on the LED driver chip 1460. The metal layer may also function as a metal-interconnect layer for the LED driver chip 1460.

The top portions of the three leads 1410, 1420, 1430 are enclosed by a light transparent encapsulate 495. The encapsulate 1495 is used to provide mechanical support for the leads 1410, 1420, 1430 to hold them in place. The encapsulate 1495 may be made of a diffused or an undiffused epoxy, depending on a desired output radiation pattern. The encapsulate 1495 may be formed by placing the top portions of the leads 1410, 1420, 1430 into a dome-shaped mold and injecting a light transparent epoxy into the mold. Although the encapsulate 1495 is shown having a hemispherical-domed shape, those skilled in the art will appreciate that the encapsulate 1495 can have various other shapes depending on the desired output radiation pattern of the LED lamp package, including a rectangular shape.

An advantage of the LED lamp package according to the invention is that it packages the LED chip 1470 and the LED driver chip 1460 together. This allows, among other things, for a systems manufacturer to conveniently plug the LED lamp package into a system for lighting applications without having to provide a separate LED driver circuit to drive the LED in the LED lamp package.

Although the LED lamp packaging methods in the above discussion were used to package the LED driver circuit according to the present invention with an LED, those skilled in the art will appreciate that the same LED packaging methods may be used to package other LED driver circuits with an LED, such as a non-voltage boosting LED driver circuit. In addition, it is to be understood that the components in FIGS. 14A and 14B are not necessarily to scale, with emphasis instead being placed upon illustrating the principles of the invention.

Figure 15B:
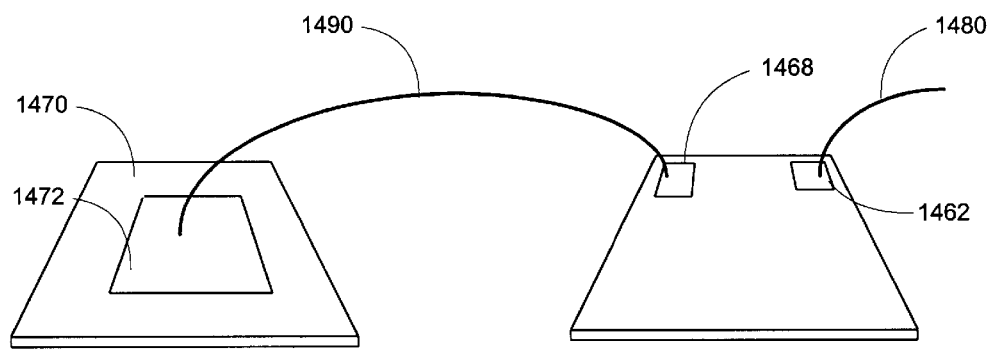
FIGS. 15A and 15B show a perspective view and a blown-up view of an LED lamp package according to another embodiment of the present invention.
Figure 15A:
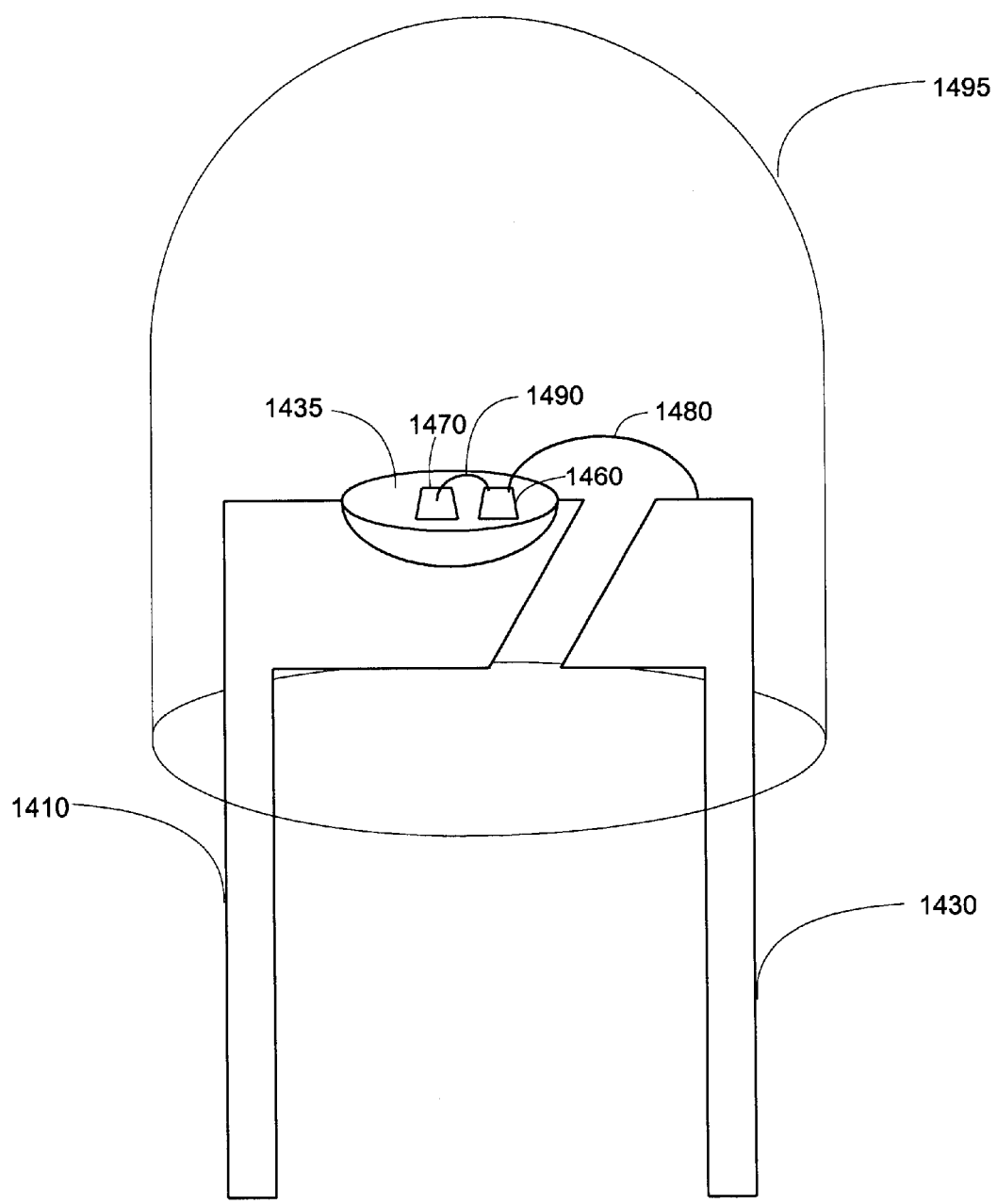

FIGS. 15A and 15B shows a perspective view and a blown-up view, respectively, of a two-lead embodiment of the LED lamp package. In this embodiment, the LED lamp package does not include the input control lead 1420 coupled to the input control of the LED driver circuit on the LED driver chip 1460. Instead, the oscillator of the LED circuit driver is configured to automatically turn on when a sufficiently high voltage power supply is applied to the LED driver circuit. This may be done, for example, by connecting the control input of the LED driver circuit to the power supply input of the LED driver circuit. That way, the oscillator of the LED driver circuit is automatically enabled when a sufficiently high power supply voltage is applied to the LED driver circuit. An advantage of the LED package according this embodiment is that it requires only two leads, namely the ground lead 1410 and the voltage supply lead 1430.

Those skilled in the art will appreciate that various adaptations and modifications of the just-described preferred embodiments of the invention can be configured without departing from the scope and spirit of the invention. Therefore, it is to be understood that, within the scope of he appended claims, the invention may be practiced other than as specifically described herein.

What is claimed is:

1. A Light Emitting Diode (LED) driver circuit, comprising:
   a charge pump having a voltage supply input and an output, said voltage supply input being connected to a voltage power supply and said output being connected to an LED; and
   an input buffer having an input and an output, said output of the input buffer being connected to the charge pump, wherein the input buffer either enables or disables the charge pump based upon a control logic signal received at its input;
   wherein the charge pump boosts the voltage of the voltage power supply at its output and the charge pump switches the LED on and off at a predetermined frequency.

2. The LED driver of claim 1, wherein the predetermined frequency is at least 40 Hz.

3. The LED driver of claim 1, further comprising an input buffer having an input and an output, said output of the input buffer being connected to the charge pump, wherein the input buffer either enables or disables the charge pump based upon a control logic signal received at its input.

3. The LED driver of claim 1, wherein the charge pump comprises:
   an oscillator having an output;
   an inverter having an input and an output, said input of the inverter being connected to the output of the oscillator;
   a capacitor having a low electrode and a high electrode; said low electrode being connected to the output of the inverter and said high electrode being connected to the LED; and
   a diode having an anode and a cathode, said anode of the diode being connected to the voltage power supply and said cathode of the diode being connected to the high electrode.

4. The LED driver of claim 1, wherein the diode is a diode-connected PFET.

5. The LED driver of claim 1, wherein the high electrode of the capacitor is connected to a second LED, and the LED driver further comprises:

a first switch connected to the first LED;
a second switch connected to the second LED; and
means for alternately switching on the first switch and the second switch.

6. The LED driver of claim 5, wherein the means for alternately switching on the first switch and the second switch comprises a ring counter having a clock input, a first output and second output, said clock input being connected to the output of the oscillator, said first output being connected to the first switch and said second output being connected to the second switch.

7. The LED driver of claim 5, wherein each one of the first switch and the second switch comprises an NFET.

8. The LED driver of claim 1, further comprising a current regulator connected to the LED for regulating the current level supplied to the LED.

9. The LED driver of claim 1, wherein the current regulator further comprises a current mirror for setting the current level supplied to the LED according to a reference current.

10. The LED driver of claim 1, further comprising a voltage regulator connected in series between the voltage power supply and the voltage supply input of the charge pump, wherein the voltage regulator outputs a threshold voltage to the charge pump when the voltage of the voltage power supply exceeds the threshold voltage and the voltage regulator outputs the voltage of the voltage power supply when the voltage of the power supply voltage is less than the threshold voltage.

11. The LED driver of claim 1, further comprising a voltage threshold detector connected to the voltage power supply and a reference voltage, wherein the voltage threshold detector sets the LED driver circuit to a first boosted voltage output when the voltage of the voltage power supply is less than the reference voltage and threshold detector sets the LED driver to a second boosted voltage output when the voltage of the voltage power supply is greater then the reference voltage.

12. A Light Emitting Diode (LED) driver, comprising:
   a diode having an anode and a cathode, the anode of said diode being connected to a voltage power supply;
   a capacitor having a low electrode and a high electrode, said high electrode being connected to the cathode of the diode and the anode of an LED; and
   an oscillator for driving the low electrode of the capacitor between a high voltage and a low voltage at a predetermined frequency.

13. The LED driver of claim 12, wherein the high voltage is approximately equal to the voltage of the voltage power supply.

14. The LED driver of claim 12, wherein the diode is a diode-connected PFET.

15. The LED driver of claim 12, wherein the high electrode of the capacitor is connected to the anode of a second LED, and the LED driver further comprises:
   a first switch connected to the cathode of the first LED;
   a second switch connected to the cathode of the second LED; and
   means for alternately switching on the first switch and the second switch.

16. The LED driver of claim 12, further comprising a current regulator connected to the LED for regulating the current level supplied to the LED.

17. The LED driver of claim 12, wherein the current regulator further comprises a current mirror for setting the current level supplied to the LED according to a reference current.

\* \* \* \* \*